United States Patent [19]

Plastow

[11] Patent Number: 5,289,550

[45] Date of Patent: * Feb. 22, 1994

[54] MODULATED LIGHT SOURCE WITH A LINEAR TRANSFER FUNCTION AND METHOD UTILIZING SAME

[76] Inventor: Robert J. Plastow, 26-1 Soden St., Cambridge, Mass. 02139

[*] Notice: The portion of the term of this patent subsequent to Jun. 22, 2010 has been disclaimed.

[21] Appl. No.: 542,594

[22] Filed: Jun. 25, 1990

Related U.S. Application Data

[63] Continuation-in-part of Ser. No. 493,458, Mar. 14, 1990.

[51] Int. Cl.⁵ .............................. G02B 6/26; G02F 1/00; G01B 9/02
[52] U.S. Cl. .................................... 385/9; 385/40; 385/41; 385/42; 385/45; 385/31; 359/187; 359/188; 356/345
[58] Field of Search .............. 350/96.11, 96.12, 96.13, 350/96.14, 96.15, 96.16, 96.29, 96.30; 356/345, 349, 350; 372/26, 29, 32, 31, 38; 385/4, 8, 9, 39, 40, 41, 45, 31, 32, 140; 359/187, 188

[56] References Cited

U.S. PATENT DOCUMENTS

| | | | |
|---|---|---|---|
| 3,471,798 | 12/1967 | Seidel | 330/151 X |
| 3,541,467 | 11/1970 | Seidel | 330/151 X |
| 4,530,603 | 7/1985 | Shaw et al. | 356/345 |
| 4,606,637 | 8/1986 | Geen | 356/350 |
| 4,637,722 | 1/1987 | Kim | 356/350 |
| 4,687,330 | 8/1987 | Lefevre | 356/350 |
| 4,842,358 | 6/1989 | Hall | 385/12 X |
| 5,042,086 | 8/1991 | Cole et al. | 356/345 X |
| 5,077,619 | 12/1991 | Toms | 359/187 |

OTHER PUBLICATIONS

J. Strauss, Electronics Letters 13, 158 (1977).
J. P. Franckart, ECOC 83, European Conference On Optical Communications, Elsevier Science Publishers, 1983, pp. 347-350.
R. D. Ridder, S. Korotky, Technical Abstract, Optical Fiber Communication Conference, San Francisco 1990.
Patterson et al., "Linearization of Multichannel Analog Optical Transmitters..." IEEE Trans. on Comm. vol. COM-27, No. 3 Mar. 1979 pp. 582-588.

*Primary Examiner*—Brian Healy

[57] ABSTRACT

Distortion in an optical transmission system is significantly reduced by the use of two modulatable optical sources with non-ideal transfer functions of electric signal to light. The output of the first modulator is sampled and then delayed using an optical delay line. The sampled signal is compared with the input signal to generate an electrical error signal. This error signal is then used to modulate the second optical source. The output of this second modulatable optical source is then combined with the delayed output from the first optical source in a four-port optical coupler in such a way that the departures from linearity (which form the error signal) are removed on both outputs of the coupler, giving two optical outputs which possess a linear transfer function of electric signal to light through the entire system. The first optical source is chosen to have high power and low noise. The second source is chosen to be low power, moderate noise. The error signal generator and ratio of optical powers are chosen such that most of the final optical output comes from the first optical source, giving a linear, high power, low noise optical signal at the output of the system. Suitable modulatable sources include diode pumped Nd-YAG lasers with waveguide Mach-Zehnder modulators, and laser diodes. This method may be used in a modulating system and a transmission system for analog signals.

25 Claims, 3 Drawing Sheets

MODULATED LIGHT SOURCE WITH A LINEAR TRANSFER FUNCTION AND METHOD UTILIZING SAME

This is a continuation-in-part of copending application entitled "Modulated Light Source With A Linear Transfer Function", having Ser. No. 07/493,458, filed in the name of Robert J. Plastow on Mar. 14, 1990, pending, the disclosure of which is incorporated herein by reference.

BACKGROUND ART

The overall scheme for reducing distortion by adding an error signal to the delayed output of a nonlinear device resembles electrical feedforward schemes, and operates under the same constraints in terms of required phase and amplitude marching in the signal and error paths. The difference is the use of light, and optical components, rather than electricity. A second difference is the system is used to produce a modulated (optical) signal rather than amplify an existing modulated (optical) signal.

A "quasi-feedforward" approach using two modulated optical devices with identical transfer functions has been previously demonstrated with light emitting diodes (Strauss, Electronics Letters 13, 158 (1977)).

A feedforward approach using two identical laser diodes has been demonstrated, where the main signal and error signal are sent over two separate fibers to two separate receivers, and then combined in a single electrical output (Franckart, ECOC 83, European Conference On Optical Communications, Elsevier Science Publishers, 1983, pp. 347-350).

Compared to the present invention, this use of two identical sources increases the received noise significantly. Two laser diodes used this way are not capable of obtaining the required 55 dB carrier to noise ratio with 80 channels of C.A.T.V. signals in a 550 MHz bandwidth, with the required −65 dB composite distortion products. The use of two diode pumped Nd-YAG or Nd-YLF lasers and two Mach-Zehnder modulators would not be an economical solution.

Also in contrast to the present invention, only one optical output is provided, divided between two optical fibers which must both be present at the receiver to generate the single electrical output.

Additionally, any change in optical length or attenuation of the two fibers will affect the main signal and the error signal unequally, and reduce the distortion cancellation. This is particularly true of optical length, where a relative change of a few inches in a 10 mile link would degrade system performance by 10 dB or more. In contrast, in the present invention, both the main signal and the error signal travel over the same fiber and are affected equally, leading to no system degradation.

A feedforward approach using two identical optical sources, each consisting of a diode laser and a Mach-Zehnder interferometer, has recently been published (Ridder et al., Technical Abstract, Optical Fiber Communication Conference, San Francisco 1990). This exhibits unacceptable noise performance for cable television, due to the low launch power and high noise of diode lasers. It would not be possible, without modification, to implement such a system with diode-pumped high power, low noise Nd-YLF lasers. This is because coherent interference at the optical combiner from two such lasers of the same wavelength would add noise to the signal. This could be avoided by the use of Nd-YAG and Nd-YLF lasers of different wavelengths or the addition of wavelength selective elements to the Nd-YAG cavity, but the use of two diode pumped lasers instead of one significantly increases the cost of the system compared to the invention described here. Again, in contrast to the present invention, only one optical output is provided, the remaining optical power being wasted in a three port combiner.

SUMMARY OF THE INVENTION

The purpose of the invention is to provide a light source whose output intensity varies linearly as a function of an input electrical signal carrying video (or other) information at frequencies in excess of several hundred megahertz. The output of the light source is fed into an optical fiber and carried as an amplitude modulated signal, in contrast to prior art designs which primarily use frequency modulation of a subcarrier to avoid problems due to the non-linearity of the light source modulators available.

This invention specifically provides two identical optical outputs which utilize all the available optical power. Each output can be sent to a separate receiver, thus providing two optical transmission links from one transmitter, which has been found superior to other previously disclosed methods.

The invention comprises:

1) a first modulatable optical source with a non-ideal transfer function, such as a waveguide Mach-Zehnder interferometer or a laser diode;

2) an optical delay line to delay the output of the first optical modulator;

3) an error signal generator which compares the non-ideal signal from the first optical source with the original input signal and provides an error signal output;

4) a second, different, modulatable optical source which is modulated by the output of the error signal generator; and 5) a 4-port optical combiner, which combines equal amounts of the delayed optical signal from 1) with the modulated optical output from 4) on each output, in such a way that the departures from linearity (which form the error signal) are removed in both outputs, giving a linear, transfer function of electrical signal to light through the system.

The first optical source is chosen to have high power and low noise. The second source is chosen to be low power, moderate noise. The error signal generator and the ratio of the source optical powers are chosen such that the majority of the final optical output comes from the first optical source, giving a linear, high power, low noise optical signal at the two outputs of the system.

BRIEF DESCRIPTION OF THE DRAWINGS

The invention will now be described in greater detail, and by way of example, with reference to the accompanying drawings, in which.

Similar components in FIGS. 1, 2, 3, are given the same reference numerals. Where FIGS. 2, 3 give a more detailed listing of components than FIG. 1 these components are given new reference numerals.

DETAILED DESCRIPTION OF THE INVENTION

The prior art in fiber optic transmission systems has utilized a variety of different devices to perform the function of transforming the input electrical signal into the transmitted optical signal. Such devices include laser diodes, light emitting diodes and waveguide Mach-Zehnder interferometers. All of these devices have a non-ideal transfer function from electrical signal to optical signal. This leads to added distortion in the transmitted signal.

In the prior art, the presence of this added distortion meant that either a low specification had to be placed on the linearity of the complete system, reducing its area of application, or the electrical signal had to be first converted into a form that was insensitive to added distortion. Such forms include digital coding and frequency modulated subcarrier. This increased the cost of the complete system and restricted the format of the incoming signals that it was able to accept.

There exists a specific requirement for transmission of signals in high performance cable television (CATV) systems in an amplitude modulated vestigial sideband (am-vsb) format, where the linearity requirements can not be met by the prior art. This invention is designed to perform this function, but is equally applicable to the transmission of any modulated electrical signal through optical fiber.

The prior art also includes the demonstration of the technique of optical feedforward using two identical modulated optical sources. This was not capable of meeting the specific requirement for high performance cable television systems.

Figure 1:
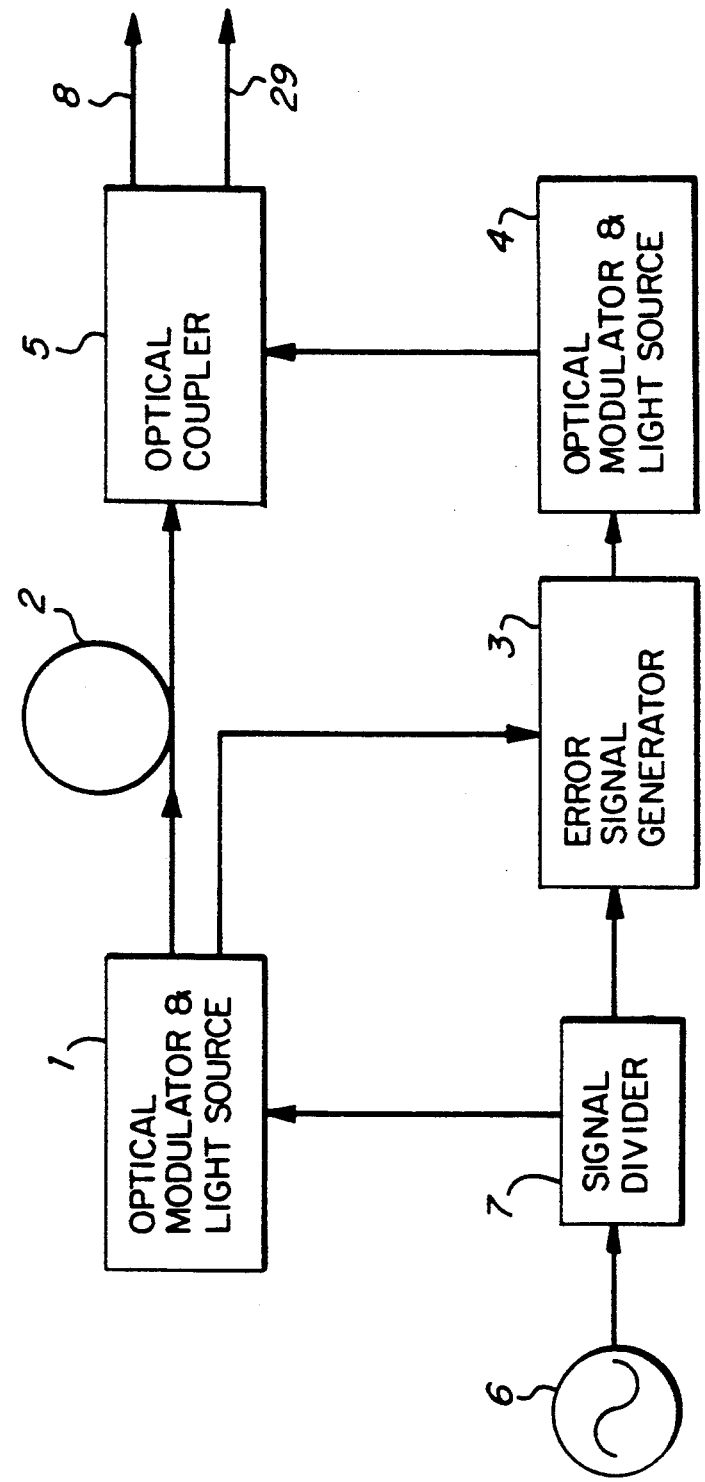
FIG. 1 is a general schematic of the invention.

The invention is shown in FIG. 1.

The invention comprises:

1) a first modulatable optical source 1 with a non-ideal transfer function, such as a waveguide Mach-Zehnder interferometer or a laser diode;

2) an optical delay line 2 to delay the output of the first optical modulator;

3) an error signal generator 3 which compares the non-ideal signal from the first optical source 1 with the original input signal 6 by means of a signal divider 7 and provides an error signal output;

4) a second, different, modulatable optical source 4 which is modulated by the output of the error signal generator 3; and 5) a 4-port optical combiner 5, which combines equal amounts of the delayed optical signal from 1 with the modulated optical output from 4 on each output, in such a way that the departures from linearity (which form the error signal) are removed in both outputs 8, 29, giving a linear transfer function of electrical signal to light through the complete system.

The first optical source 1 is chosen to have high power and low noise. The second source 4 is chosen to be low power, moderate noise. The error signal generator 3, optical combiner 5, and the ratio of the source optical powers are chosen such that the majority of the final optical output power comes from the first optical source, giving a linear, high power, low noise optical signal at the two outputs 8, 29 of the system.

PREFERRED EMBODIMENT

Figure 2:
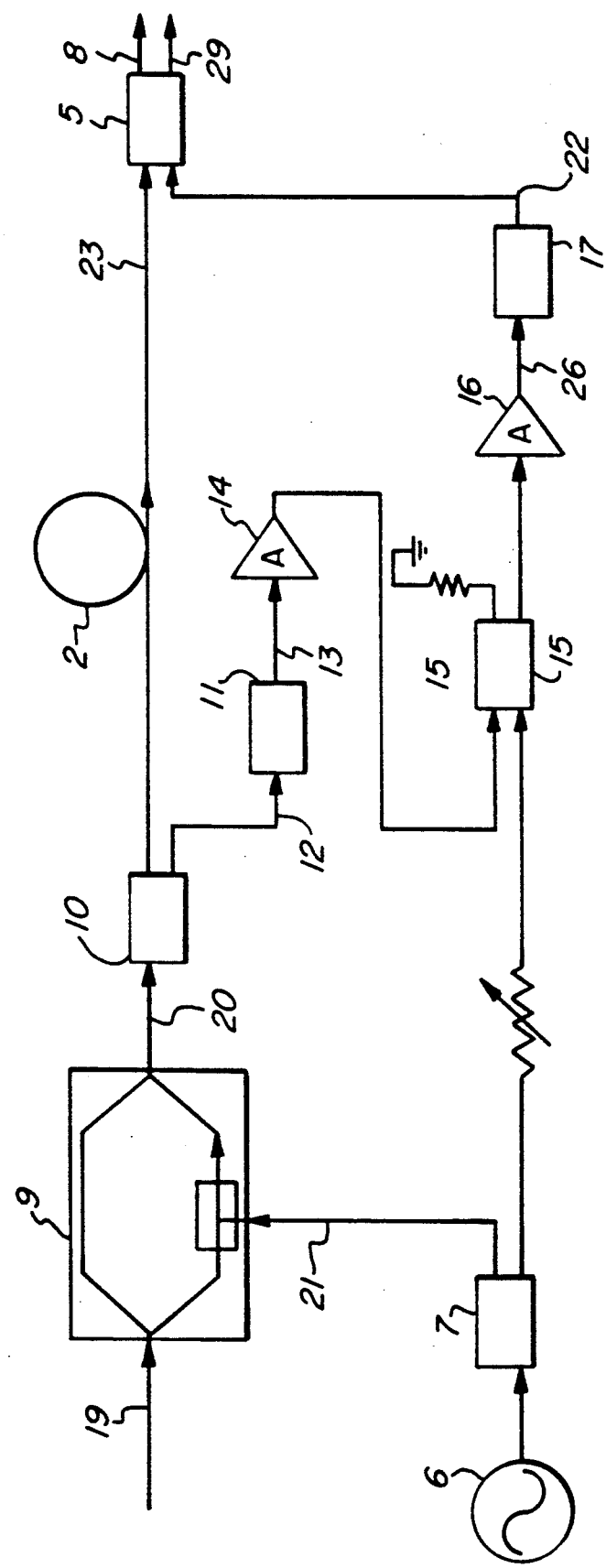
FIGS. 2 and 3 are more detailed schematics of two alternative versions of the preferred embodiment of the invention.

The preferred embodiment is shown in FIG. 2. It comprises:

1) A waveguide Mach-Zehnder interferometer 9.

2) Single mode optical fiber 2.

3) A method 10 to divert a proportion of the modulated light, followed by a detector 11 to convert this light 12 to electric current 13, followed by an amplification stage 14, followed by a directional coupler 15, or similar, to subtract a sample of the input signal 6, followed by a second amplifier 16 to drive the second modulatable optical source 17.

4) A semiconductor diode laser 17.

5) A 4-port optical coupler 5.

The "method of diverting a proportion of the input signal" referred to above can be either a conventional y-splitter 10, either using planar waveguides or optical fiber, or a directional coupler output on the Mach-Zehnder interferometer 18.

The unmodulated optical input is obtained from, for example, a diode-pumped Nd-YLF laser operating at 1313 nm. This shows high output power and low noise. The second optical source 4 (e.g. diode laser 17) is chosen to have a different wavelength to the first optical source 1, to avoid coherent interference. As described below, it can have low power and high noise compared to the first optical input 19. The error signal generator is an electrical directional coupler 15, e.g. minicircuits TDC-10-2. As described below, other components are equally valid.

The object is to obtain a sufficiently linear transfer function with sufficient modulated optical power emitted from the system to overcome noise in both the transmitter and the eventual receiver, such that the required signal: noise ratio and linearity is obtained. The more nearly the transfer function approaches linear, the larger the amount of the total optical power that can be modulated for any given distortion level, and therefore the larger the eventual received electrical signal. Equally, for any fixed modulation depth, the larger the total optical power the larger the received modulated electrical signal.

The advantage of using a Mach-Zehnder waveguide interferometer 9 is that the total optical power 20 can be made arbitrarily large, independent of the modulation depth, as it does not depend on the modulator 9, but on the input light source 19. For the same reason, the noise associated with the optical signal 20 (relative intensity noise, R.I.N.) can be made arbitrarily small. However, the transfer function is not linear, but instead has the form $L = 1 + \cos V$, where L is proportional to light amplitude, and V proportional to voltage 21. This limits the amount of modulated light for any given distortion.

The purpose of the invention is to generate an optical error signal 22 which is combined with the delayed optical signal 23 in such a way as to remove this distortion without significantly reducing the power and noise performance of the system, and in a cost effective manner. In particular, the invention utilizes all the optical power from both optical sources 22, 23 to economically provide two separate optical outputs 8, 29 both containing the correct ratio of main signal and error signal required to provide linear operation.

This is achieved by the use of a high power, low noise laser as the input 19 to the first optical modulator 9, and a low power, relatively high noise laser diode 17 as the second modulatable source 4, and a 4-port, 50—50 optical combiner 5 to provide the outputs 8, 29.

Figure 3:
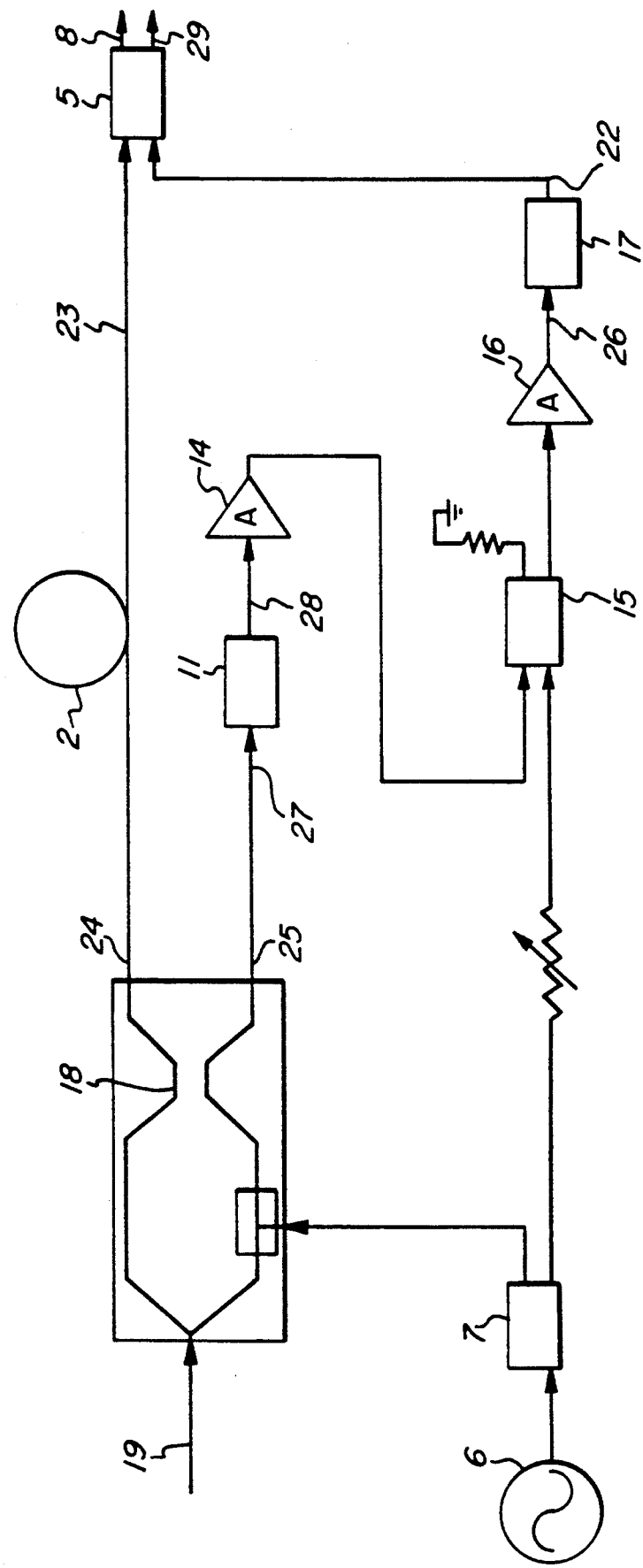

The method (at 10 in FIG. 2 or at 18 in FIG. 3) of diverting the optical signal, and of combining 5 the delayed optical signal 23 with the optical error signal 22, is chosen such that the final optical outputs 8, 29 consist mostly of light from the first optical source 19.

The two stages of amplification 14, 16 are chosen such that the error signal 22 is sufficiently large to cancel the distortion. This requires that the error signal 22 be a larger proportion of the total light output from the second optical source 4 (e.g. laser diode 17) than the distortion is a proportion of the total light from the first optical source 1 (e.g. 19, 9). It is advantageous that this second source 4 be more linear than the first 1, in order to faithfully reproduce the electrical error signal 26. However, as the distortion is typically at least 45 dB less than the signal, considerable amplification of the error signal is possible, even with a non-linear second optical source.

The noise contribution of the two sources 1, 4 to the final signal 8, 29 is proportional to the amount of light from each source in the final output. As the second optical source 4 is a small fraction of the total outputs 8, 29, it can exhibit a high relative intensity noise (R.I.N.) without degrading the final signal. This is an important feature of the invention.

Plastow, in the parent to this application (Ser. No. 07/493,458, filed Mar. 14, 1990), pending, utilized this feature to provide a high power, low noise, low distortion, single output optical transmitter which could use a very low power, high noise optical source as the second optical source. This was achieved in part by combining a small fraction of the second source with a large fraction of the main signal in a three-port optical combiner. This is advantageous if the requirement is for a single optical transmission link, where the received carrier to noise performance is improved if more power is provided by the main signal.

However, if multiple transmission paths are required, the use of a three port coupler in this fashion is not desirable. This is because the three port coupler is inherently a symmetric, four-port coupler in which one output is not used. Thus if, for example, 15% of the second modulatable source is coupled into the output fiber, 15% of the delayed main signal and 85% of the second modulatable source are coupled into the unused fourth port and wasted. In this instance the fourth port can not be used as an output. This is because the ratio of main signal to error signal will not be the same as in the designated output port 8, and therefore only one output 8 will correctly provide linear, low distortion transmission.

In the invention described here the three port coupler is replaced by a four-port coupler designed to have a 50:50 split ration at both wavelengths used. In this case, both outputs 8, 29 contain exactly half of both inputs 22, 23, and therefore the ratio of error signal to main signal is the same in both outputs 8, 29 and both can provide linear, low distortion transmission. The output in any one fiber is in general less than in the prior Plastow disclosure described above, but the total output is greater as there is now no optical signal wasted in the coupler 5. This makes the invention advantageous for systems which use the transmitter output to go to multiple receivers.

The total power in each output 8, 29 will in general contain a greater proportion of the second modulatable source 4 than in the prior Plastow invention. This requires that the relative intensity noise of this source must be less than before if it is to make the same contribution to total noise. However, the total power from the first source 1 is in general considerably greater than that from the second source 4. The noise of the second source 4 can therefore be correspondingly higher before it starts to dominate, and therefore only moderate noise performance is required of this second source 4.

Compared to the use of the prior Plastow invention, the requirements on linearity of the second source 4 are further reduced, as the greater proportion of coupled power from this source means that the same modulated optical signal in the outputs 8, 29 can be produced by a smaller electrical signal 26, which will cause less distortion of this second source 4.

As in the previous invention, the Mach-Zehnder modulator can also be utilized to maximize the optical power in the error signal and reduce the required amplification. If the y-coupler 10 of the interferometer is replaced by a directional coupler 18 (FIG. 3) the transfer function of the upper output 24 has the form $1 + \cos V$, while the function of the lower arm 25 has the form $1 - \cos V$. Therefore, the required sample optical signal can be obtained from one arm 25 by simply inverting the detected optical signal 28, without reducing the amplitude of the output signal 24 in the other arm (the inverting function can be performed by the directional coupler 15). This gives a sample signal 27 as large as the output signal 24.

It should be noted that wherever Mach-Zehnder interferometers are used it will be necessary in practice to use conventional feedback schemes to correct for drift of the bias point and period of the transfer function.

A feature of this invention and the previous Plastow invention is that the optical delay line 2 is required to equalize the delay of the main signal 23 and error signal 22 such that they both combine at the receiver detector at the same time. As the two signals are at different optical wavelengths they will in general travel down optical fiber at different speeds due to fiber dispersion. Therefore, the delay line 2 will in general be of different length for different length fiber transmission paths. This invention therefore requires that either the two optical outputs 8, 29 are sent down equal dispersion fiber lengths, or that the product of fiber dispersion and wavelength difference gives a time delay that still provides acceptable distortion cancellation. For a signal bandwidth of 500 MHz, an acceptable $+/-2$ degrees error in arrival time of the two signals, a 3 nm wavelength difference around 1313 nm, and the dispersion of typical fiber, the allowed difference in link length for the two output paths is about $+/-3$ km, which is quite acceptable.

Although the invention has been described with reference to particular embodiments, features, materials of construction and the like, these are not intended to exhaust all possible features, and indeed many other modifications and variations will be ascertainable to those of skill in the art.

I claim:

1. An apparatus for optically transmitting an input signal with reduced distortion, comprising:
    a first modulatable optical source, having substantially high power and substantially low noise characteristics, for receiving the input signal and for outputting an optical signal;
    an optical delay for delaying the optical signal;
    an error signal generator for receiving both the input signal and the optical signal, and for outputting an error signal indicative of a difference between the input signal and the optical signal;

a second modulatable optical source, having substantially moderate power and noise characteristics, for receiving the error signal and for outputting an optical error signal; and means for combining the optical signal and the optical error signal to provide at least one optical output signal with reduced distortion as compared with the optical signal, the optical output signal powered mainly by the optical signal.

2. The apparatus of claim 1 wherein said first optical source comprises a waveguide Mach-Zehnder interferometer.

3. The apparatus of claim 1 wherein said Mach-Zehnder interferometer is biased near its most linear region with a test signal in a feedback loop.

4. The apparatus of claim 1 wherein said first optical source comprises a diode pumped laser selected from the group comprising Nd-YAG and Nd-YLF lasers.

5. The apparatus of claim 1 wherein said second optical source comprises a laser diode.

6. The apparatus of claim 1 wherein said error signal generator comprises a photodetector and an electrical directional coupler.

7. The apparatus of claim 1 wherein said optical delay comprises an optical fiber, and comprising means for adjusting said optical delay to compensate for dispersion in the optical output signal.

8. The apparatus of claim 1 comprising means for delaying the error signal to compensate for operation of said optical delay.

9. The apparatus of claim 1 comprising at least one optical fiber connectable with said optical combining means for transmitting the optical output signal.

10. The apparatus of claim 1 comprising at least one remote optical receiver for receiving the optical output signal.

11. An apparatus for optically transmitting an input signal comprising:

a first modulatable optical source for receiving the input signal and for outputting an optical signal;

an optical delay for delaying the optical signal;

an error signal generator for receiving both the input signal and the optical signal, and for outputting an error signal indicative of a difference between the input signal and the optical signal;

a second modulatable optical source for receiving the error signal and for outputting an optical error signal; and a four-port optical combiner for combining the optical signal and the optical error signal to provide two optical output signals.

12. The apparatus of claim 11 wherein said first optical source comprises a waveguide Mach-Zehnder interferometer biased near its most linear region.

13. The apparatus of claim 11 wherein said first optical source comprises a diode pumped laser and said second optical source comprises a laser diode.

14. The apparatus of claim 12 wherein said optical delay comprises an optical fiber, and comprising means for adjusting said optical delay to compensate for dispersion in the optical output signal.

15. The apparatus of claim 11 comprising means for delaying the error signal to compensate for operation of said optical delay.

16. The apparatus of claim 11 comprising at least one optical fiber connectable with said four-port optical combiner for transmitting the optical output signal.

17. The apparatus of claim 11 comprising at least one remote optical receiver for receiving the optical output signal.

18. A method for optically transmitting an input signal with reduced distortion, comprising the steps of:

providing a substantially high power optical source;

providing a substantially low power optical source;

generating a substantially high power optical signal by modulating the substantially high power optical source with the input signal;

delaying the optical signal;

producing an error signal by comparing the input signal with the optical signal;

generating a substantially low power optical error signal by modulating the substantially low power optical source with the error signal; and combining the substantially high power optical signal and the substantially low power optical error signal to provide at least one optical output signal with reduced distortion as compared with the optical signal.

19. The method of claim 18 wherein the producing step comprises converting the optical signal to an electrical signal, and subtracting the electrical signal from the input signal.

20. The method of claim 18 wherein the delaying step comprises transmitting the optical signal through an optical fiber, and including the step of adjusting the delaying step to compensate for dispersion in the optical output signal.

21. The method of claim 18 including the steps of delaying the error signal to compensate for the delaying of the optical signal.

22. The method of claim 18 comprising the step of transmitting the optical output signal.

23. The method of claim 18 comprising the step of receiving the optical output signal.

24. The method of claim 18 wherein the combining step comprises providing two optical output signals of substantially equal power.

25. An apparatus for optically transmitting an input signal with reduced distortion, comprising:

a first modulatable optical source, having substantially high power and substantially low noise characteristics, for receiving the input signal and for outputting an optical signal;

an optical delay for delaying the optical signal;

an error signal generator for receiving both the input signal and the optical signal, and for outputting an error signal indicative of a difference between the input signal and the optical signal;

a second modulatable optical source, having substantially moderate power and noise characteristics, for receiving the error signal and for outputting an optical error signal; and means for combining the optical signal and the optical error signal to provide at least one optical output signal with reduced distortion as compared with the optical signal; and the first optical source with a waveguide Mach-Zehnder interferometer.

* * * * *